United States Patent
Tan et al.

(10) Patent No.: US 8,819,529 B2
(45) Date of Patent: Aug. 26, 2014

(54) METHOD OF COMMUNICATION

(75) Inventors: Peng Hui Tan, Singapore (SG); Sumei Sun, Singapore (SG); Chin Keong Ho, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 184 days.

(21) Appl. No.: 13/201,449

(22) PCT Filed: Feb. 9, 2010

(86) PCT No.: PCT/SG2010/000045
§ 371 (c)(1),
(2), (4) Date: Aug. 12, 2011

(87) PCT Pub. No.: WO2010/093332
PCT Pub. Date: Aug. 19, 2010

(65) Prior Publication Data
US 2011/0296271 A1   Dec. 1, 2011

(30) Foreign Application Priority Data

Feb. 12, 2009 (SG) .................................. 200901050

(51) Int. Cl.
*H03M 13/03* (2006.01)
*H04L 1/06* (2006.01)
*H03M 13/25* (2006.01)
*H03M 13/00* (2006.01)
*H04B 7/155* (2006.01)
*H04L 1/00* (2006.01)

(52) U.S. Cl.
CPC ........... *H04L 1/0618* (2013.01); *H03M 13/258* (2013.01); *H03M 13/6513* (2013.01); *H04L 1/0643* (2013.01); *H04B 7/15592* (2013.01); *H04L 1/0009* (2013.01); *H04L 1/0015* (2013.01); *H04L 1/0066* (2013.01); *H04L 2001/0097* (2013.01)

USPC .......................................................... 714/786

(58) Field of Classification Search
CPC .......... H03M 13/258; H03M 13/2957; H03M 13/6513; H04L 1/0618; H04L 1/0643
USPC .................. 714/748, 752, 786; 375/211, 267; 370/315
See application file for complete search history.

(56) References Cited

U.S. PATENT DOCUMENTS

2005/0226414 A1   10/2005   Lee et al.
2009/0262678 A1*  10/2009   Oyman et al. ................ 370/315

FOREIGN PATENT DOCUMENTS

CN       1615609 A     5/2005
CN       101179350 A   5/2008

OTHER PUBLICATIONS

Anghel et al., On the performance of distributed space time coding systems with one and two non-regenerative relays, Mar. 2006, IEEE, Trans. on Wireless Comm. vol. 5, No. 3, pp. 682-692.*

(Continued)

*Primary Examiner* — Shelly A Chase
(74) *Attorney, Agent, or Firm* — Blakely, Sokoloff, Taylor & Zafman LLP

(57) ABSTRACT

A method of communication comprising determining whether to use distributing coding between a source (S), relay (R) and destination (D), based on a predetermined transmission rate; if the determination is positive, determining a forward error correction scheme using distributed Alamouti space-time coding, wherein the scheme is determined based on the predetermined transmission rate, a channel signal-to-noise ratio (SNR) and a network topology; relaying coded data from the S to the D using the determined forward error correction.

15 Claims, 17 Drawing Sheets

Increment bits

Joint network and channel coding

(56) References Cited

OTHER PUBLICATIONS

Agustin et al., Evaluation of Turbo HARQ schemens for cooperative MIMO transmission, 2004, IEEE, p. 20-24.*

PCT International Search Report for PCT Counterpart Application No. PCT/SG2010/000045 containing Communication relating to the Results of the International Search Report, 1 pg., (Apr. 19, 2010).

PCT Written Opinion of the International Searching Authority for PCT Counterpart Application No. PCT/SG2010/000045, 5 pgs., (Apr. 19, 2010).

PCT Written Opinion of the International Preliminary Examing Authority for PCT Counterpart Application No. PCT/SG2010/000045, 5 pgs., (Feb. 1, 2011).

Adrian Agustin, et al., "Evaluation of Turbo Coded Cooperative Retransmission Schemes", IST Mobile and Wireless Communications Summit, 5 pgs., (Jun. 2004).

Rohit U. Nabar, et al., "Fading Relay Channels: Performance Limits and Space-Time Signal Design", IEEE Journal on Selected Area in Communications, vol. 22, No. 6, pp. 1099-1109, (Aug. 2004).

First Office Action for corresponding Chinese Patent Application No. 20080013900.X, 10 pages (including English translation), (Oct. 10, 2013).

* cited by examiner

3rd time slot without cooperation

3rd time slot with cooperation

3rd time slot with cooperation

1st time slot

2$^{nd}$ time slot without cooperation

2$^{nd}$ time slot with cooperation

Increment bits　　　　Joint network and channel coding

METHOD OF COMMUNICATION

CROSS-REFERENCE TO RELATED APPLICATIONS

This patent application is a U.S. National Phase application under 35 U.S.C. §371 of International Application No. PCT/SG2010/000045, filed Feb. 09, 2010, entitled A METHOD OF COMMUNICATION, which claims priority to Singapore patent application number 200901050-5, filed Feb. 12, 2009.

FIELD OF THE INVENTION

The present invention relates to a method of communication, a relay station, a base station, a communication network, a user equipment and an integrated circuit, and relates particularly though not solely to distributed rate setting and coding schemes.

BACKGROUND

The following abbreviations may be used in this specification:
MAC multiple access channels
CMAC cooperative MAC
MARC multiple access relay channels
BRC broadcast relay channels
DF decode-and-forward
SNR signal to noise ratio
FER frame error rate
RSC recursive convolutional code
LO local oscillator
AWGN additive white Gaussian noise
BPSK binary phase shift keying
CC convolutional code
BS base station
UE user equipment
OFDM orthogonal frequency division multiplex
SCCP single carrier cyclic prefix
OFDMA orthogonal frequency division multiple access
SC-FDMA single-carrier frequency division multiple access
DFT-Spread-OFDM discrete Fourier transform spread OFDM
FEC forward error correction
STBC space time block code
LLR log-likelihood ratio
IR incremental redundancy
CP cyclic prefix
TDMA time division multiple access
RS relay station
MIMO multiple input multiple output
ACK acknowledgement
NACK negative acknowledgement
SDMA spatial division multiple access
EXIT extrinsic information transfer
S source
R relay
D destination
CC($\bullet$) convolutional code with settings in parenthesis
PCC($\bullet$) parallel concatenated code with settings in parenthesis
$P_{out}(\bullet)$ probability of information outage
I($\bullet$) mutual information
$\gamma_{AB}$ the SNR from A to B
$SNR_{AB}^{(N)}$ the SNR from A to B in the N-th time slot

SUMMARY OF THE INVENTION

In general terms the invention relates to combining distributed Alamouti space-time coding with decode-and-forward cooperative relay strategy using distributed rate-compatible error correction codes. This may have one or more advantages such as:
1. a simple and/or systematic technique for designing a code for a cooperative relay network may provide increased wireless capacity and link quality;
2. a coding technique for a cooperative relay network with a low implementation complexity, for example using convolutional codes; and/or
3. a code design for a cooperative relay network which may have an error performance that is close to the theoretical optimum.

In a first particular expression of the invention there is provided a method of communication according to claim 1.
In a second particular expression of the invention there is provided a RS as claimed in claim 11.
In a third particular expression of the invention there is provided a RS as claimed in claim 12.
In a fourth particular expression of the invention there is provided a BS as claimed in claim 13.
In a fifth particular expression of the invention there is provided a communication network as claimed in claim 14.
In a sixth particular expression of the invention there is provided a UE as claimed in claim 15.
In a seventh particular expression of the invention there is provided an IC as claimed in claim 16.
The invention may be implemented according to any of the embodiments in claims 2 to 10.

BRIEF DESCRIPTION OF THE DRAWINGS

One or more example embodiments of the invention will now be described, with reference to the following figures, in which.

DETAILED DESCRIPTION

In the following one or more example embodiments are described including a simple relay channel and three MAC network topologies in which multiple users need to exchange information sequences (packets) with a base station, namely, CMAC, MARC and BRC. In MARC, one or more dedicated relays are deployed to assist users' transmission to the base station, whereas in CMAC, no dedicated relays are available. In BRC, only one user is broadcasting with the help of one or more dedicated relays.

1. System Model

Figure 1:
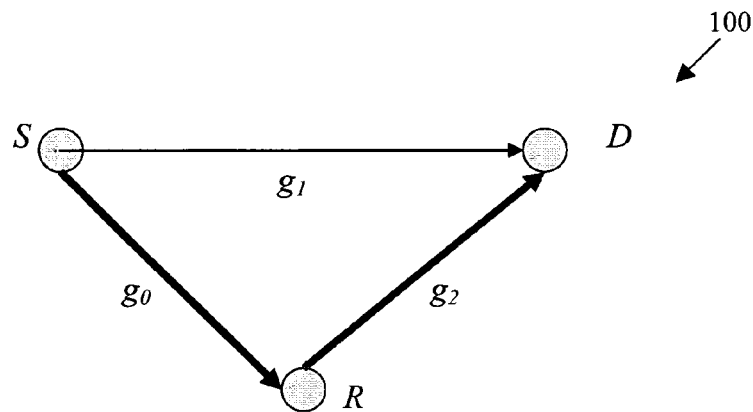
FIG. 1 is an illustration of a simple 3-node relay channel model according to a first example embodiment.

FIG. 1 shows a relay channel model 100, with a S, R and D. The channel coefficients between S-R, S-D and R-D nodes are $g_0$, $g_1$, and $g_2$, respectively. We assume a quasi-static fading channel, where the channel coherence time is considerably larger than the code word. The channel coefficients are independent and identically-distributed random variables, which remain constant over the whole duration of the codeword, given by Equation 1:

$$g_i = \frac{h_i}{d_i^{\beta/2}}, \quad (1)$$

where $h_i$ and $d_i$ are the channel gains and distances between the transmitter and receiver, respectively. The attenuation exponent is $\beta$ (e.g., $\beta=2$ for free-space propagation).

The relay operates in half-duplex mode, where the transmitting and listening modes cannot occur simultaneously. In the DF protocol, the block of symbols with length n is split into two phases. In the first phase, the relay is in listening mode and receives the signal from the source. At the end of this phase, the relay decodes the source information message. The relay then switches to transmitting mode in the second phase and sends symbols to help the destination decode the source message. During the first phase, the signal received by the relay is given by Equation 2:

$$y_{r,k} = g_0 x_{s,k} + v_k, \quad k=1, 2, \ldots, \alpha n, \quad (2)$$

and the signal received by the destination is given by Equation 3:

$$y_k = g_1 x_{s,k} + w_k, \quad k=1, 2, \ldots, \alpha n. \quad (3)$$

where $x_{s,k}$ denotes the codeword that is to be transmitted from the source, $v_k$ denotes the additive noise introduced in the channel between the source and the relay, and $w_k$ denotes the additive noise introduced in the channel between the source and the destination. $\alpha$ denotes the proportion of symbols that is to be devoted to the first phase.

During the second phase (i.e. the relay transmitting phase), the signal received by the destination is given by Equation 4:

$$y_k = g_1 x_{s,k} + g_2 x_{r,k} + w_k, \quad k=\alpha n+1, \ldots, n. \quad (4)$$

Here, $x_s = [x_{s,1} \ldots x_{s,n}]^T$ a is the source codeword, drawn from the code $\chi_s$. We assume that the symbols $x_{r,k}$ transmitted by the relay are from an auxiliary code $x_r$ with length n. Only the last $(1-\alpha)n$ symbols of a codeword are effectively transmitted in the second phase. In the first phase, the relay is idle because of the constraints of half-duplex communication.

The noise variables $v_k \sim CN(0,\sigma_v^2)$ and $w_k \sim CN(0,\sigma_w^2)$ at the relay and destination, respectively, are mutually independent. $v_k$ and $w_k$ are complex variables and the notation ~CN (●) denotes a complex Gaussian distribution. We also impose the same per-symbol average power constraint for both the source and the relay in Equation 5:

$$E[|x_{s,k}|^2] \leq E_s \text{ and } E[|x_{r,k}|^2] \leq E_s \quad (5)$$

where $E_s$ denotes the symbol energy and $E[\ ]$ denotes an expectation operation. The SNRs of the S-D and the S-R links are defined as $\gamma = E_s/\sigma_w^2$ and $\tilde{\gamma} = E_s/\sigma_v^2$, respectively. $\sigma_v^2$ and $\sigma_w^2$ can be chosen such that $\sigma_v^2 = \sigma_w^2$.

2. Alamouti-DF Scheme

A DF protocol with the relay code $\chi_r$ such that the signal received at the destination forms an Alamouti constellation, shall be referred to as the Alamouti-DF scheme. Assuming that the relay can decode the signal, the signal transmitted by the relay at time k is given by Equation 6:

$$x_{r,k} = \begin{cases} x_{s,k+1}^*, & k = \alpha n + 1, \alpha n + 3, \ldots \\ -x_{s,k-1}^*, & k = \alpha n + 2, \alpha n + 4, \ldots \end{cases} \quad (6)$$

$x_{s,k+1}^*$ denotes the complex conjugate of $x_{s,k+1}$. The signal seen by the destination for $\alpha n+1 \leq k \leq n$ is an Alamouti constellation. Through linear processing of the received signal, the destination obtains the sufficient statistics for decoding, as are given by Equation 7:

$$\tilde{y}_k = \begin{cases} g_1 x_{s,k} + w_k, & k = 1, \ldots, \alpha n \\ \sqrt{|g_1|^2 + |g_2|^2}\, x_{s,k} + \tilde{w}_k, & k = \alpha n+1, \ldots, n, \end{cases} \quad (7)$$

where the statistical properties of $\tilde{w}_k$ are identical to those of $w_k$. The mutual information per symbol at the destination is given by Equation 8:

$$I(\gamma, g_1, g_2) = \alpha I(|g_1|^2 \gamma) + (1-\alpha) I((|g_1|^2 + |g_2|^2)\gamma) \quad (8)$$

On the other hand, if the source does not transmit during the second phase, the mutual information is given by Equation 9:

$$I(\gamma, g_1, g_2) = \alpha I(|g_1|^2 \gamma) + (1-\alpha) I(|g_2|^2 \gamma) \quad (9)$$

With a large n, the probability of a FER is the information outage probability which is defined in Equation 10:

$$P_{out}(\gamma, R) = Pr\{I(\gamma, g_1, g_2) \leq R\}, \quad (10)$$

where R is the target transmission rate in bits per channel use. For large SNR, the $P_{out}$ is given in Equation 11:

$$P_{out}(\gamma, R) \sim \kappa \gamma^{-d}, \quad (11)$$

where $\kappa$ is the coding gain independent of $\gamma$ and d is referred to as SNR exponent or diversity.

3. Distributed Coding FEC

A distributed turbo coding scheme may use a recursive convolutional code (RSC). When decoding the message at the relay, the interleaved message is encoded with another RSC code. To further improve the decoding capability at the relay, an enhanced turbo code scheme may be used. Instead of the RSC, a turbo code may be used at the source node in the distributed turbo coding scheme. In addition to the systematic bits, the source node transmits a punctured sequence of parity bits from the first and second constituent encoders. The relay then transmits all the punctured parity bits. The punctured turbo code has more parity bits at the destination, resulting in an enhanced turbo code. Note that in all the above mentioned schemes, systematic codes are used. The distributed turbo coding and the enhanced turbo code schemes may be combined to produce a multiple turbo code at the destination. For the distributed multiple turbo code scheme, the source also transmits using a turbo code. Instead of sending the punctured parity bits at the relay, the interleaved message is encoded with another constituent code.

The coding techniques (such as but not limited to RSC, turbo codes or their corresponding constituent codes) may optionally employ puncturing.

In the following, we assume an AWGN channel (i.e., the channel gain $h_i=1$) where the SNR of source-destination channel is insufficient to support the desirable rate R.

Figure 2:
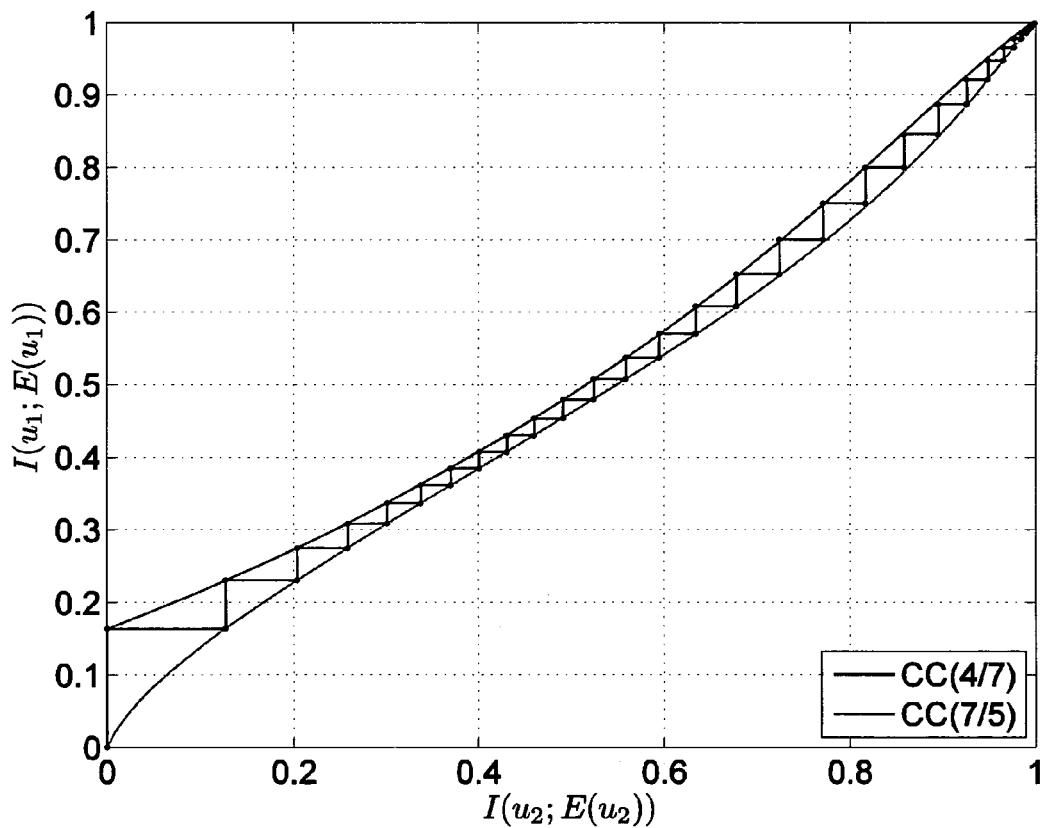
FIG. 2 is a graph of a Distributed Turbo coding at destination for a relay network with $\alpha=0.5$, $\gamma_{SD}=-3$ dB and $\gamma_{RD}=-2.1$ dB.

The setup for the distributed turbo coding scheme is as follows. The non-systematic RSC $C_1$ at the source is CC(4/7) with $R_1=1$ and the RSC $C_2$ at the relay is CC(7/5) with $R_2=1$. These codes are used together with BPSK modulation as shown in Equation 12:

$$x_{s,k} = \{-\sqrt{E_s}, \sqrt{E_s}\}, \quad (12)$$

producing an overall rate of R=1/2 bits per channel use for half-duplex mode with $\alpha=0.5$. The SNR of the S-D channel is set as shown in Equation 13:

$$\gamma_{SD} = 10 \log_{10}(|g_1|^2 \gamma) = -3.0 \text{ dB}, \quad (13)$$

which may be sufficient for 1/2 bits per channel use. The relay transmits the codeword from $C_2$, assuming the SNR of the S-R channel $\gamma_{SR}$ is high enough for the relay to decode the message reliably. FIG. 2 illustrates the EXIT chart for this distributed turbo coding scheme when the SNR of the R-D channel is set as out in Equation 14:

$$\gamma_{RD} = 10 \log_{10}(|g_2|^2 \gamma) = -2.1 \text{ dB}. \quad (14)$$

The average decoding trajectory is also included. A tunnel exists to allow for the convergence of iterative decoding towards a low error rate. A rate of ½ bits per channel use is achievable for $\gamma_{RD}=-2.6$ dB. Hence, this code operates approximately 0.4 dB from the theoretic limit.

Figure 3:
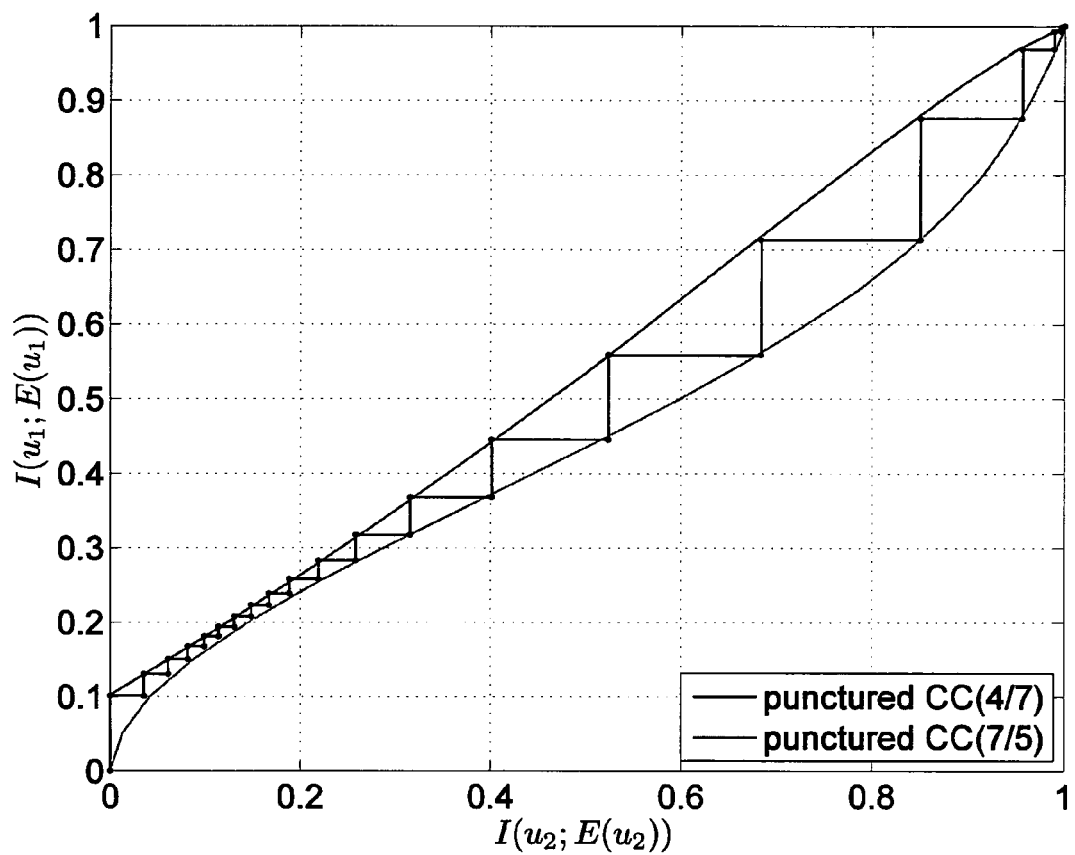
FIG. 3 is a graph of an Enhanced Turbo code at relay for a relay network with $\alpha=0.75$, $\gamma_{SR}=0.1$ dB, $\gamma_{SD}=-3$ dB and $\gamma_{RD}=-1.2$ dB.
Figure 4:
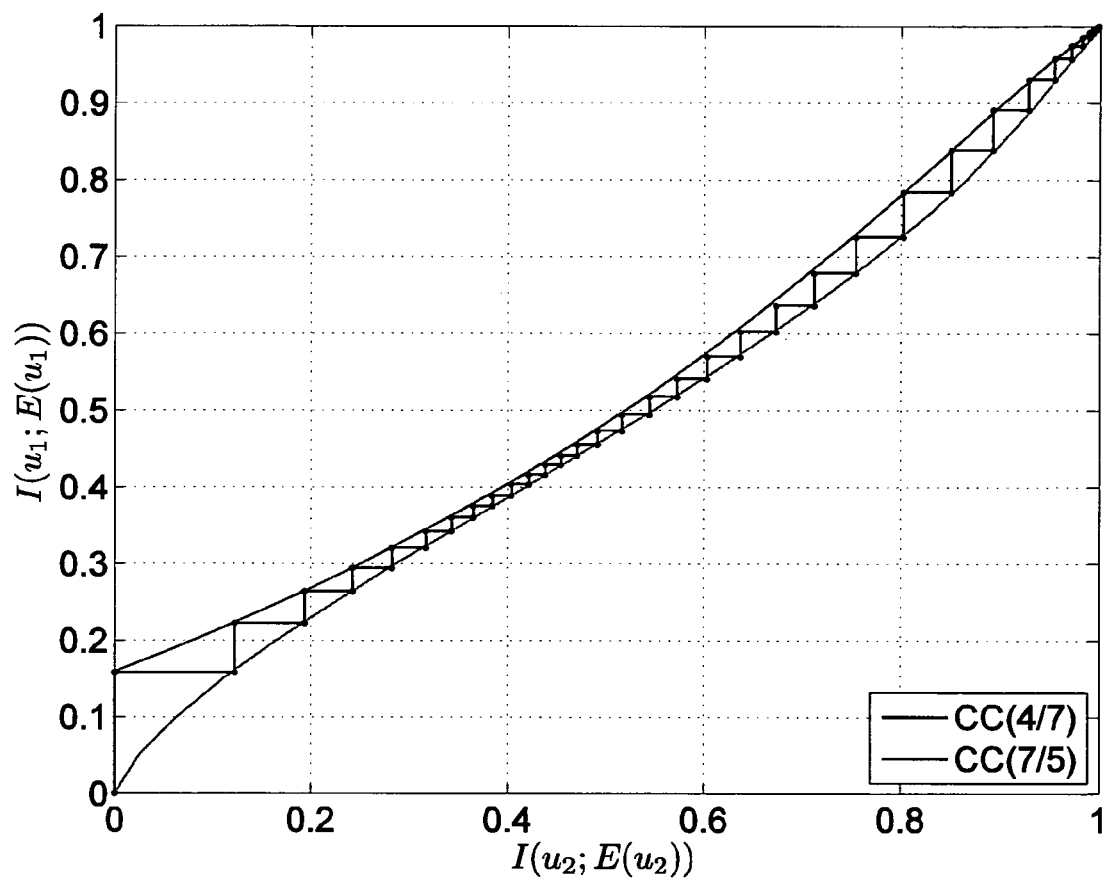
FIG. 4 is a graph of an Enhanced Turbo Code at destination for a relay network with $\alpha=0.75$, $\gamma_{SR}=0.1$ dB, $\gamma_{SD}=-3$ dB and $\gamma_{RD}=-1.2$ dB.

When $\gamma_{SR}$ is low, the enhanced turbo code scheme is required for the message to get across reliably to the relay. Again, we select our target rate to be R=½ bits per channel use for half-duplex mode. Since $\gamma_{SR}$ is low, we need to increase $\alpha$ to get the message across to the relay. We select $\alpha=0.75$. The SNR for the S-D channel is set at $\gamma_{SD}=-3.0$ dB. The codeword sent by the source is formed by puncturing the turbo code which is made up of constituent codes $C_1$ and $C_2$. The puncturing patterns for $C_1$ and $C_2$ are [1011] and [1110], respectively. Since the relay only receives data in the first time slot, the relay would only see $C_1$ and $C_2$, which constitutes a rate 2/3 punctured turbo code. The EXIT chart for the iterative decoding algorithm is given in FIG. 3. A tunnel exists to allow for convergence of iterative decoding towards a low error rate at $\gamma_{SR}=0.1$ dB. The SNR limit for a rate 2/3 is −0.7 dB. The relay then transmits the punctured parity bits to the destination. FIG. 4 illustrates the EXIT chart for the iterative decoding at the destination. A tunnel exists to allow for convergence of iterative decoding towards low error rate at $\gamma_{RD}=-1.2$ dB. The theoretical SNR limit is −2.3 dB. Hence, this code is operating approximately 1.1 dB from the theoretic limit.

Figure 5:
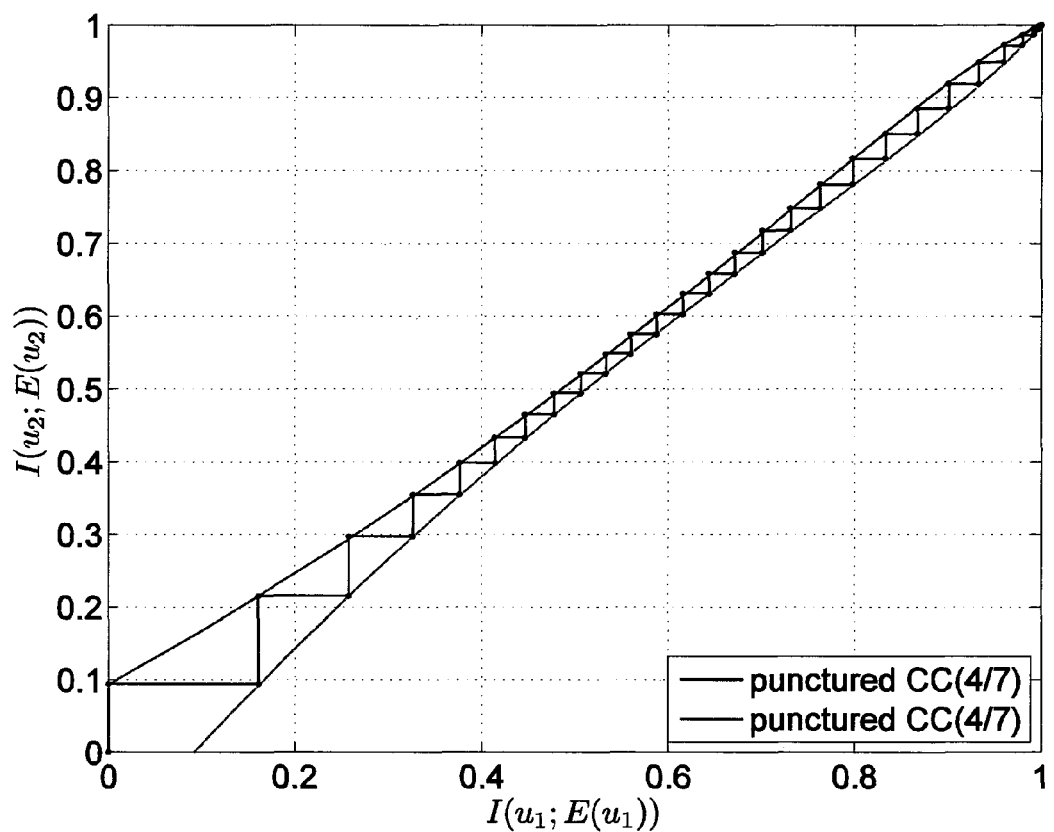
FIG. 5 is a graph of a Distributed multiple Turbo code at relay for a relay network with $\alpha=0.75$, $\gamma_{SR}=-0.2$ dB, $\gamma_{SD}=-3$ dB and $\gamma_{RD}=-1.5$ dB.
Figure 6:
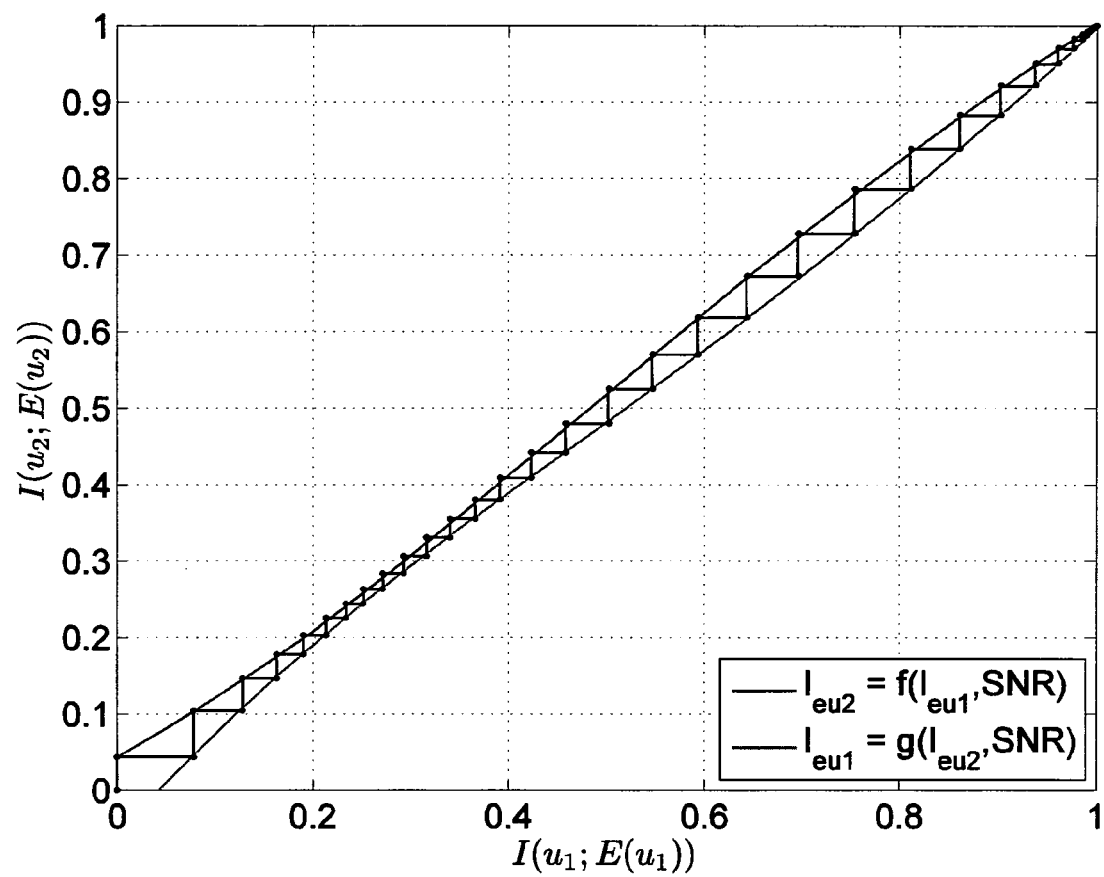
FIG. 6 is a graph of a Distributed multiple Turbo code at destination for a relay network with $\alpha=0.75$, $\gamma_{SR}=-0.2$ dB, $\gamma_{SD}=-3$ dB and $\gamma_{RD}=-1.5$ dB.

Instead of sending the punctured parity bits, the relay uses a encoder in the distributed multiple turbo code scheme. The encoder can optionally use puncturing in its coding scheme. The constituent codes $C_1$, $C_2$ and $C_3$ are CC(4/7), CC(4/7) and CC(3), respectively. In FIG. 5, a tunnel exists to allow for convergence of iterative decoding towards low error rate at $\gamma_{SR}=-0.2$ dB, which is lower than the enhanced turbo code scheme in FIG. 3. The convergence of iterative decoding towards low error rate is possible at $\gamma_{RD}=-1.5$ dB, as shown in FIG. 6. This code is operating approximately 0.8 dB from the theoretical limit.

4. Alamouti-DF Scheme with Distributed Coding

According to an example embodiment, an Alamouti-DF scheme is used with a distributed turbo code, an enhanced turbo code and a multiple turbo code schemes. The fading coefficients $\{h_i\}$ are Rayleigh distributed as represented in Equation 15:

$$p(h_i) = 2h_i e^{-h_i^2}, \; h_i \geq 0 \quad (15)$$

Figure 7:
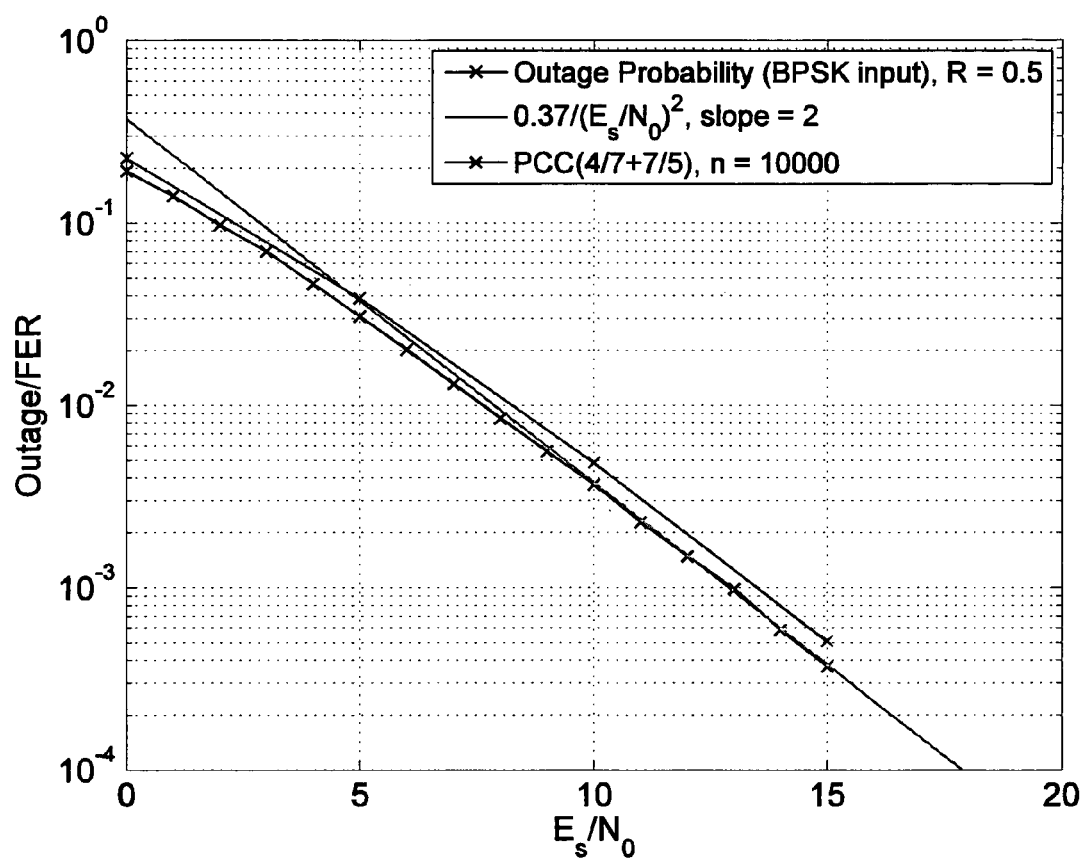
FIG. 7 is a graph of an outage and FER of distributed Turbo coding at destination for a relay network with $\alpha=0.5$.

FIG. 7 shows the outage probability and FER performance of an Alamouti-DF scheme with distributed turbo code. The setting of the relay is such that $d_1^{-\beta}=1$ and $d_2^{-\beta}=1.23$, where $d_1$ denotes the distance between the source and the destination and $d_2$ denotes the distance between the relay and the destination. The slot allocation is $\alpha=0.5$ and the target rate is R=0.5. With BPSK modulation, the outage probability has a diversity of 2. The FER of the distributed turbo code ($C_1$ and $C_2$) is about 1 dB from the outage limit and has the same order of diversity.

Figure 8:
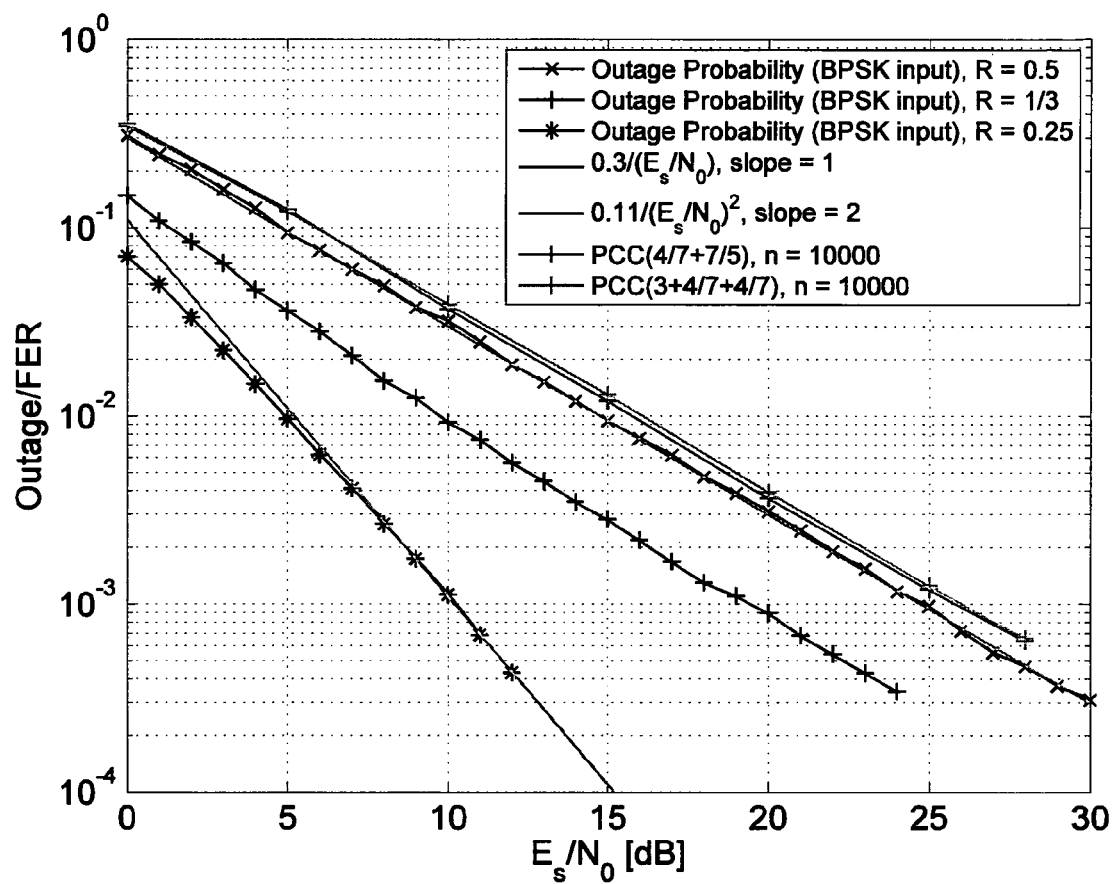
FIG. 8 is a graph of an outage and FER of an enhanced Turbo coding and multiple Turbo coding at destination for a relay network with $\alpha=0.75$.

FIG. 8 shows the outage probability and FER performance of an Alamouti-DF scheme with enhanced turbo code and multiple turbo code. We set $\alpha=0.75$, $d_1^{-\beta}=1$ and $d_2^{-\beta}=1.51$. The outage probability has a diversity of 2 only if $R \leq (1-\alpha)$. With R=0.5, only a diversity of one may be achieved. Similarly, the FER of the enhanced turbo code PCC(4/7+5/7) and the multiple turbo code PCC(3+4/7+4/7) is around 1 dB from the outage limit with diversity one.

5. Rate Setting

According to the first example embodiment a node (for example the relay) acquires the channel state information, e.g., the SNR parameters, via, e.g., estimation based on preambles sent by the node, or feedback from the other nodes in the network. The transmission rate is set based on the channel state information by using a rate setting algorithm.

Firstly a target rate is set for the user. If the channel quality information shows that the target rate can be supported, then direct link transmission is used. If the target rate cannot be supported by direct link transmission, then distributed coding is used.

For distributed coding, given the SNRs of the network, parameters may be selected to ensure reliable transmission is possible. For example, the slot duration for each phase of transmission should be minimized, e.g., by using high-rate coded modulation, so as to improve the overall efficiency. The slot duration in some communication phases can be optimized by, e.g., using an information theoretical approach to obtain the rate region of the protocol adopted. This rate region provides a minimum SNR threshold which is required for operating at a certain rate. With these values, the minimum power to support the target rate can be obtained. If the SNR is below the minimum threshold, the target rate is reduced and the rate setting procedure starts all over again.

As discussed later a FEC approach is taken to achieve the selected rate. The rate information and the FEC parameters are transmitted to the nodes in the network and the nodes then start the transmission based on the set rate, code, and protocol.

6. Transmission Protocol

Figure 25:
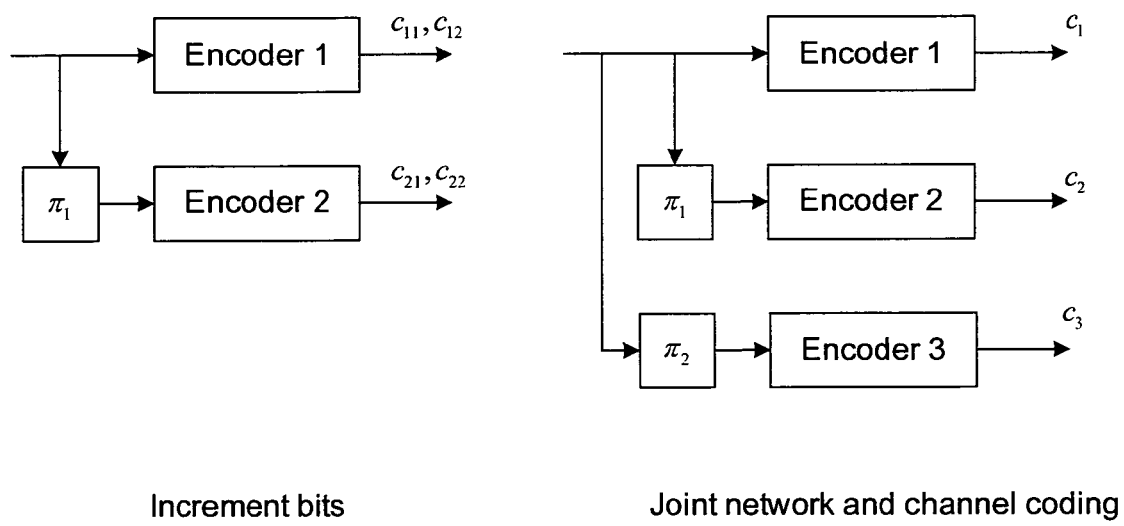
FIG. 25 is a flowchart of the encoding structures for distributed coding.

The transmission protocol for the relay network in FIG. 1 will now be described. A Node S works in cooperation with a Node R to deliver its packets to a Node D. In the $1^{st}$ time slot Node S transmits and Node R receives the coded bits and tried to decode its information. We consider two distributed coding scheme: (i) incremental bits and (ii) joint network and channel coding. Their encoding structures are shown in FIG. 25. For incremental bits, Node S sends the codeword $(c_{11}, c_{21})$ during the first time slot. $c_{11}$ is the codeword produced by Encoder 1 and $c_{21}$ is the codeword produced by Encoder 2 during the first time slot. When joint network and channel coding is used, Node S sends the codeword $(c_1, c_2)$. $c_1$ and $c_2$ respectively are the codewords produced by Encoder 1 and Encoder 2. ACK/NACK information is sent out from node R to Node S and D.

In the $2^{nd}$ time slot, if NACK is received from Node R, the source will operate in anon-cooperative mode. If ACK is received, Node S and D will operate in a cooperative mode. In cooperative mode Node R sends either $(c_{12}, c_{22})$ or $(c_3)$ with the source using a STBC. $c_{12}$ and $c_{22}$ are the codewords produced by Encoder 1 and Encoder 2 respectively during the $2^{nd}$ time slot while $c_3$ is the codeword produced by Encoder 3. In the non-cooperative configuration, Node S transmits additional coded bits during the $2^{nd}$ and last time slot for additional redundancy. For incremental bits, S1 sends $(c_{12}, c_{22})$ while for joint network and channel coding, S1 sends $(c_3)$.

7. Encoding Scheme

Two types of distributed coding schemes are shown in FIG. 25. Firstly the incremental bit encoders are rate 1 convolutional or recursive convolutional codes with appropriate puncturing patterns. The rate of codeword $(c_{11}, c_{21})$ is optimized for the SNR of the source to relay channel, while the rate of codeword $(c_{11}, c_{12}, c_{21}, c_{22})$ is optimized for the SNR of the relay to destination and the source to destination channel. Optimization of the code is done by pairing the extrinsic information transfer function of each of the component code, so that the SNR of the decoding threshold is minimized.

The joint network and channel coding encoders are rate 1 convolutional or recursive convolutional codes with appropriate puncturing patterns. The rate of codeword $(c_1, c_2)$ is optimized for the SNR of the source to relay channel, while the rate of codeword $(c_1, c_2, c_3)$ is optimized for the SNR of the relay to destination and the source to destination channel. Similarly, extrinsic information transfer functions are used to minimize the SNR of the decoding threshold.

With Incremental bits, in the cooperation phase, the source and the relay act like a virtual MIMO system and send the codeword $(c_{21}, c_{22})$ using a STBC. With joint network and channel coding, in the cooperation phase, the source and the relay act like a virtual MIMO system and send codeword $(c_3)$ using a STBC.

8. Extension to Other Systems

Figure 9:
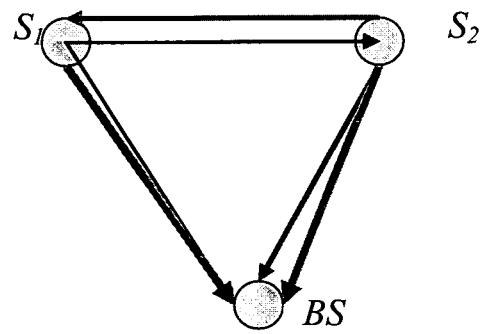
FIG. 9 is an illustration of a two-user CMAC system according to a second example embodiment.
Figure 10:
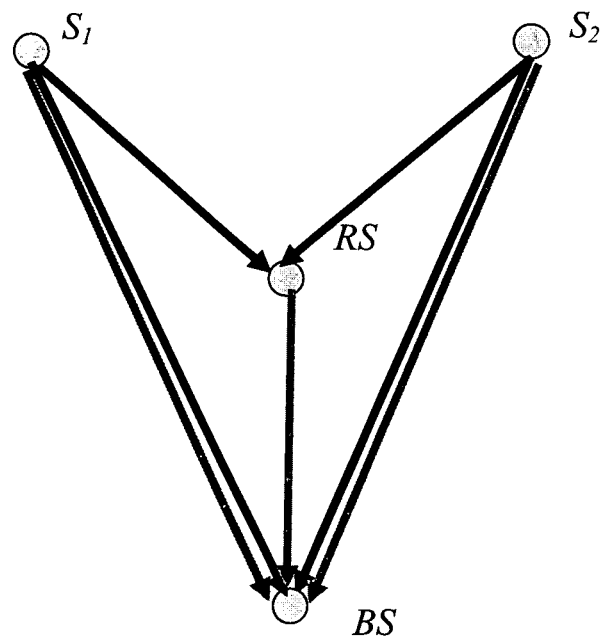
FIG. 10 is an illustration of a two-user MARC system according to a third example embodiment.
Figure 11:
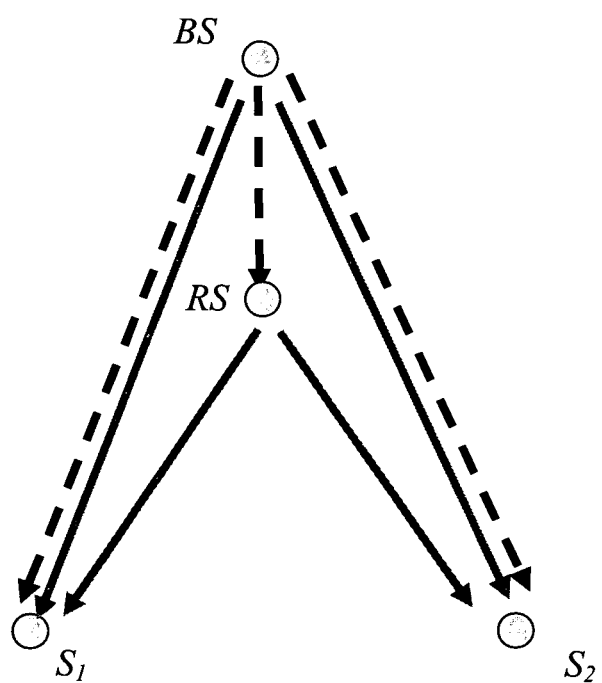
FIG. 11 is an illustration of a two-user BRC system according to a forth example embodiment.

The Alamouti-DF scheme with distributed coding for the relay network can also be extended to other systems, like the second example embodiment CMAC shown in FIG. 9, the third example embodiment MARC shown in FIG. 10 and the forth example embodiment BRC shown in FIG. 11. Orthogonal channels can be assigned to each pair by using, e.g., TDMA, OFDMA, SC-FDMA, DFT-Spread-OFDM or SDMA.

8.1 CMAC Topology

We consider two users, S1 and S2, communicating with the BS using OFDM/SCCP in FIG. 9. The cooperative distributed coding and Alamouti transmission may use three time slots to complete one cooperation cycle.

8.8.1 Time Slot 1

S1 transmits a FEC-coded and OFDM/SCCP modulated sequences, where the FEC code rate is given in Equation 16:

$$R_1 \leq \alpha_1 I(\mathrm{SNR}_{S_1 S_2}^{(1)}) \tag{16}$$

where $\alpha_1$ is the fraction of time slot 1 and $\mathrm{SNR}_{S_1 S_2}^{(1)}$ is the SNR from S1 to S2. The coding scheme used in the transmission from S1 may optionally employ puncturing.

8.1.2 Time Slot 2

S2 transmits FEC-coded and OFDM/SCCP modulated sequences, where the FEC code rate is given in Equation 17:

$$R_2 \leq \alpha_2 I(\mathrm{SNR}_{S_2 S_1}^{(1)}) \tag{17}$$

where $\alpha_2$ is the fraction of time slot 2 and $\mathrm{SNR}_{S_2 S_1}^{(1)}$ is the SNR from S2 to S1.

8.1.3 Time Slot 3

In this time slot, Alamouti-DF scheme with the enhanced turbo code and the multiple turbo code schemes can be used. The procedure of encoding for the enhanced turbo code scheme is the same as that for the relay network illustrated in FIG. 1. As for the multiple turbo code scheme, each user interleaves the two information sequences separately, followed by feeding the sequences alternatively to an encoder.

S1 and S2 then transmit the sequence with distributed Alamouti STBC. The Alamouti STBC provides diversity gain and reduces outage in a fading channel. The BS collects the received sequence, and computes the LLR based STBC decoding for the IR. It then performs FEC decoding using all the LLR information collected during the 3 time slots.

The rate region for time slot 3 for the enhanced turbo code scheme is similar to that for the relay network. For the multiple turbo code scheme, the rate region is given by Equation 18:

$$R_1 \leq \alpha_1 I(\mathrm{SNR}_{S_1 D}^{(1)}) + \alpha_3 I(\mathrm{SNR}_{S_1 D}^{(2)} + \mathrm{SNR}_{S_2 D}^{(2)})$$

$$R_2 \leq \alpha_2 I(\mathrm{SNR}_{S_2 D}^{(1)}) + \alpha_3 I(\mathrm{SNR}_{S_1 D}^{(2)} + \mathrm{SNR}_{S_2 D}^{(2)}) \tag{18}$$

$$R_1 + R_2 \leq \alpha_1 I(\mathrm{SNR}_{S_1 D}^{(1)}) + \alpha_1 I(\mathrm{SNR}_{S_2 D}^{(1)}) + \alpha_3 I(\mathrm{SNR}_{S_1 D}^{(2)} + \mathrm{SNR}_{S_2 D}^{(2)})$$

where $\alpha_3$ is the fraction of time which slot 3 occupies, $$\sum_{t=1}^{3} \alpha_t = 1.$$

The achievable rate of the system is given by the intersection of the rate regions. Note that Users 1 and 2 do not have any new information to send during this slot.

8.1.4 BS Processing

At the BS, iterative decoding is performed to decode the information bits of Users 1 and 2, which is the same as the relay network if the enhanced turbo code scheme is used. For the multiple turbo coding scheme, iterative decoding is also used for the information sequences.

Figure 12:
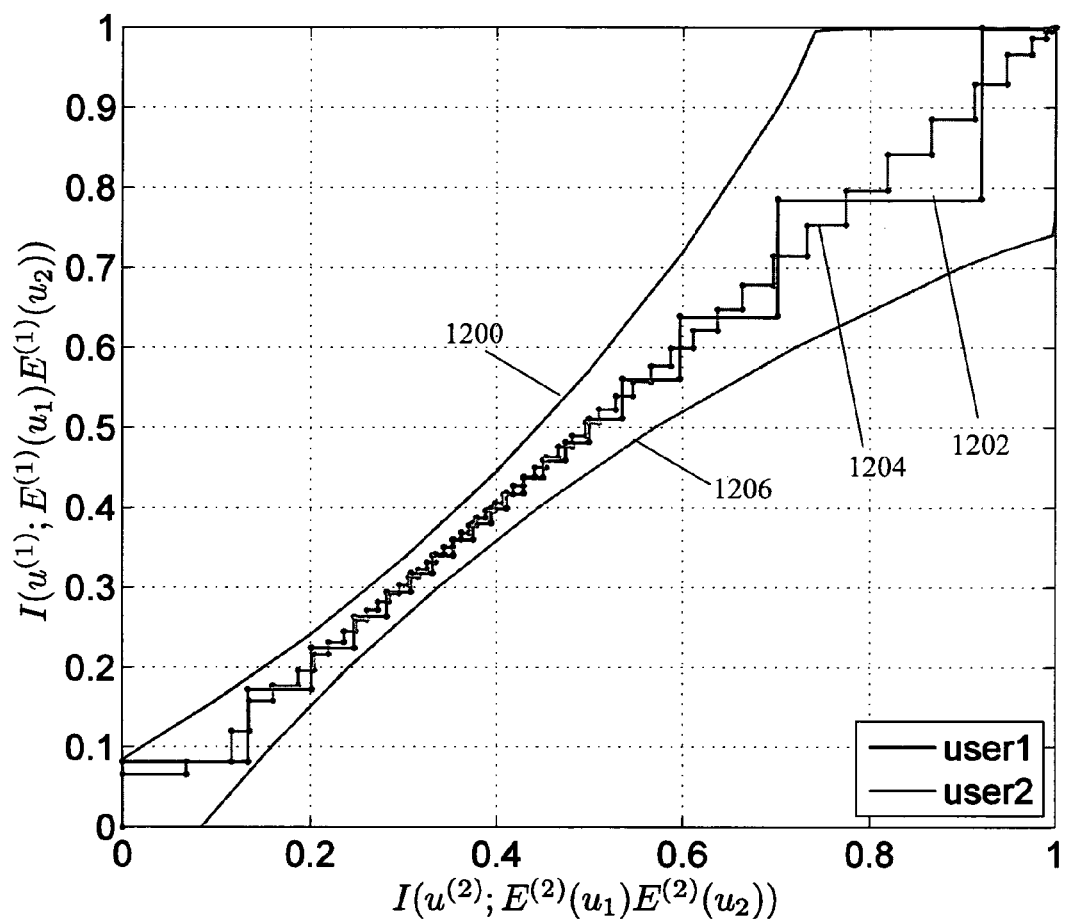
FIG. 12 is a graph of a Multiple Turbo code at destination for a cooperative network with $\alpha_1=\alpha_2=0.375$, $\gamma_{S_1D}=\gamma_{S_2D}=-3.3$ dB.

FIG. 12 illustrates the EXIT chart for the multiple turbo coding scheme when $\gamma_{S_1 D} = \gamma_{S_2 D} = -3.3$ dB in an AWGN channel. $\gamma_{S_1D}$ and $\gamma_{S_2D}$ respectively denote the SNRs of the S1-D and the S2-D links. The settings of the network is such that $d_{S_1D}{}^{-\beta}=1$ and $d_{S_2D}{}^{-\beta}=1$. $d_{S_1D}$ denotes the distance between S1 and D while $d_{S_2D}$ denotes the distance between S2 and D. The slot allocation used is $\alpha_1=\alpha_2=0.375$ and the target rate is $R_1=R_2=0.25$. S1 and S2 use the multiple turbo code PCC(3+4/7+4/7). The upper bound curve 1200 and the lower bound curve 1206 respectively illustrate the extrinsic log-ratios from $C_1$ and $C_2$ for the EXIT function $I(u^{(1)};E^{(1)}(u_1)E^{(2)}(u_1))$ of S1, where $u^{(1)}$ denotes the information bits from S1, while $E^{(1)}(u_1)$ and $E^{(1)}(u_2)$ denote the extrinsic LLR from the $C_1$ and $C_2$ of S1. Each vertical step in the EXIT chart corresponds to an activation of the iterative decoding for S1, until convergence occurs. Similarly, each horizontal step corresponds to the activation of the iterative decoding for S2 until convergence occurs. The step curve 1202 corresponds to the mutual information measured at the output of the decoders under such an activation scheme. For lower complexity, we considered the activation of S1 ($C_1$–$C_2$–$C_3$) and S2 ($C_1$–$C_2$–$C_3$). The step curve 1204 corresponds to the mutual information measured at the output of the decoders. The convergence of iterative decoding towards low error rate is possible since a tunnel exists at −3.3 dB. The theoretic limit for the target rates is −3.6 dB.

Figure 13:
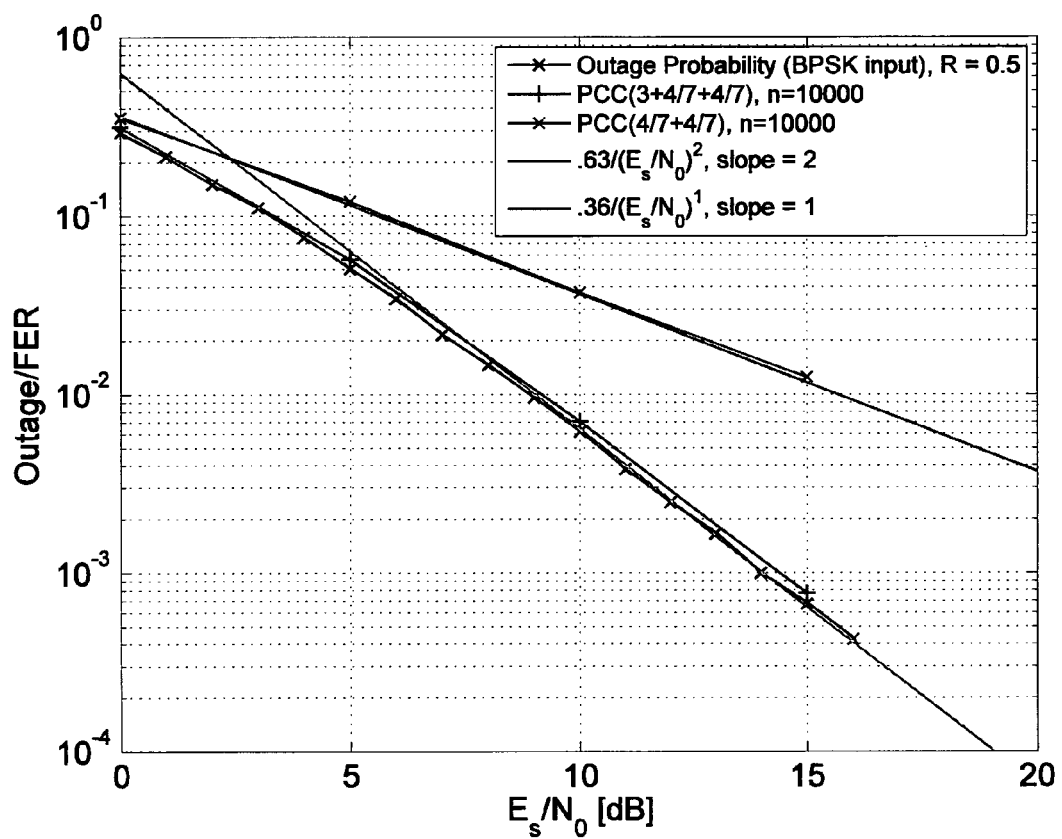
FIG. 13 is a graph of an outage and FER of a multiple Turbo coding and an enhanced Turbo coding at destination for a cooperative network.
Figure 14:
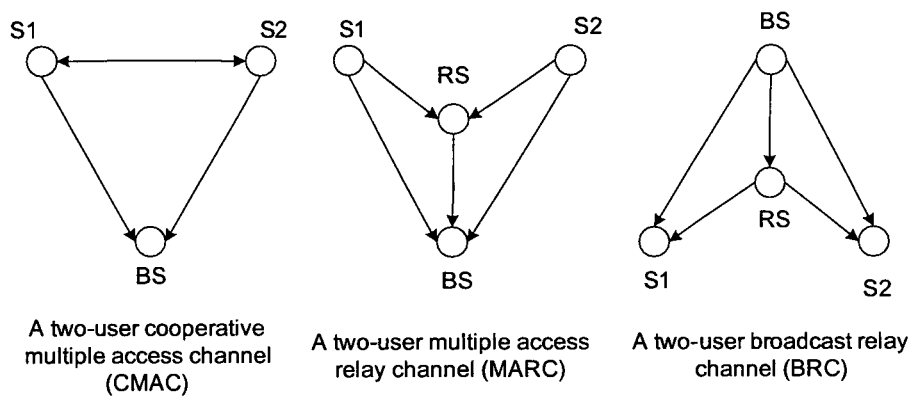
FIG. 14 is an illustration of the Network configurations.

FIG. 13 shows the outage probability and FER performance. The outage probability of the multiple turbo code has a diversity of 2, which is higher that of the enhanced turbo code scheme, which has a diversity of 1. The multiple turbo code PCC(3+4/7+4/7) has an outage that is around 0.3 dB from the outage limit.

8.1.5 Training for Channel Estimation

Normal training for time slot 1 and time slot 2 and orthogonal training sequence, e.g., the training sequences of [a a] for S1, [a −a] for S2.

8.1.6 Time and Frequency Synchronization

Conventional time and frequency synchronization can be used for time slot 1 and time slot 2. For time slot 3, the two sequences should be aligned within the CP at BS so as to maintain subcarrier orthogonality. The two users should also use the same LO reference, e.g., the BS LO frequency, for easier frequency synchronization at BS.

8.1.7 Transmission Protocol

Figure 15:
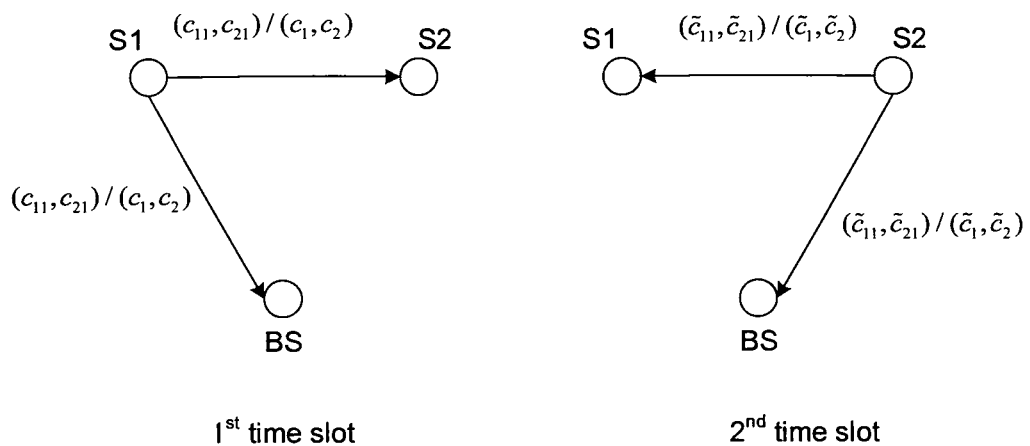
FIG. 15 is an illustration of the CMAC: $1^{st}$ and $2^{nd}$ time slot.

For the CMAC network in FIG. 9, S1 and S2 work in cooperation to deliver their packets to a common destination BS. In the 1$^{st}$ time slot Node S1 transmits, while Node S2 transmits in the 2$^{nd}$ time slot. Each S node receives the coded bits sent by its partner node and attempts to decode its partner information. The transmission scheme for these 2 time slots is shown in FIG. 15. The codeword transmitted depends on which distributed coding scheme is used. For incremental bits, Node S1 sends the codeword ($c_{11},c_{21}$). When joint network and channel-coding is used, Node S1 sends the codeword ($c_1,c_2$). If decoding is successful, then this information will be relayed to the destination BS. ACKs/NACKs information is sent out from the source nodes to indicate whether they are cooperating or not in the 3$^{rd}$ time slot.

Figure 17:
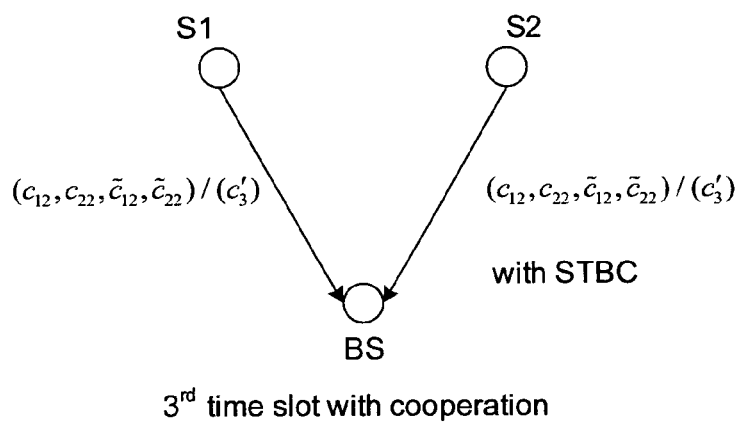
FIG. 17 is an illustration of a CMAC: $3^{rd}$ time slot with cooperation.
Figure 18:
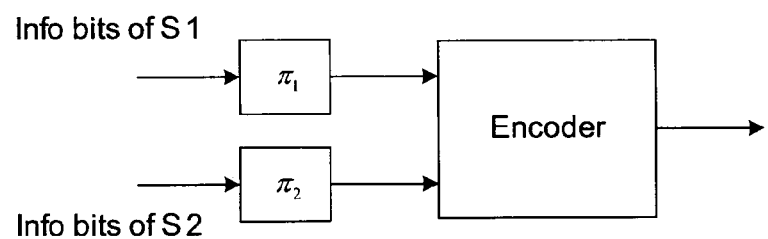
FIG. 18 is a flowchart of the Joint network and channel encoding.

In the 3$^{rd}$ time slot, cooperation occurs when both the sources send ACKs. Otherwise, the sources will operate in a non-cooperative mode. In the cooperative configuration, as shown in FIG. 17, Node S1 and S2 encode both information bit streams either jointly or separately and transmit them to the destination BS using a STBC. For separate encoding, the codeword ($c_{12},c_{22},\tilde{c}_{12},\tilde{c}_{22}$) is sent by S1 and S2 using STBC. For joint network and channel encoding, as shown in FIG. 18, S1 and S2 send the codeword ($c_3'$) to the destination, also using STBC. $c_{12}$ and $c_{22}$ are the codewords sent by S1 while $\tilde{c}_{12}$ and $\tilde{c}_{22}$ are the codewords sent by S2.

Figure 16:
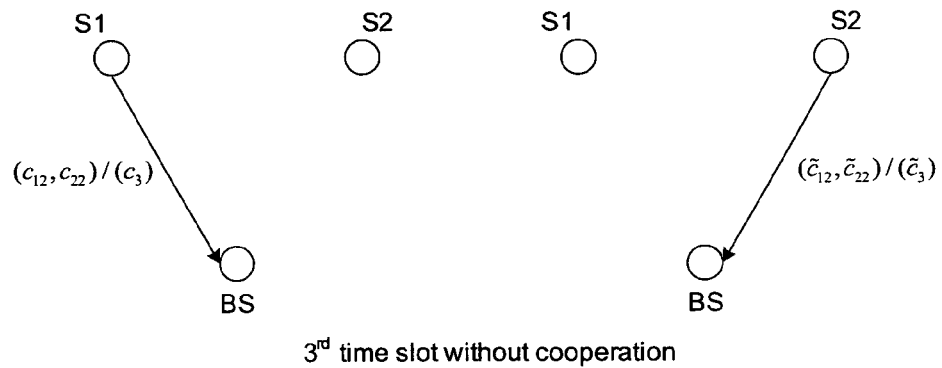
FIG. 16 is an illustration of a CMAC: $3^{rd}$ time slot without cooperation.

In the non-cooperative configuration, as shown in FIG. 16, Node S1 and S2 transmit their own additional coded bits in turn during the 3$^{rd}$ and last time slot for additional redundancy. For incremental bits, S1 sends ($c_{12},c_{22}$) while for joint network and channel coding, S1 sends ($c_3$).

8.2 MARC Topology

FIG. 10 shows S1 and S2, communicating with a BS through a RS using OFDMA. Orthogonal subcarrier sets are assigned to the two users.

The proposed cooperative incremental redundancy space-time-coded relay transmission may need two time slots to complete one cooperation cycle.

8.2.1 Time Slot 1

S1 transmits punctured FEC-coded and OFDM modulated sequences, where the FEC coded-modulation rate is $R_{S_1R}$ according to Equation 19:

$$R_{S_1R} \leq \alpha_1 I(\text{SNR}_{S_1R}{}^{(1)}) = R_1{}^{(1)} \tag{19}$$

$\alpha_1$ is the fraction of time slot 1. When TDMA is used for user multiple access, $\alpha_1$ denotes the fraction of time user 1 occupies in slot 1.

8.2.2 Time Slot 2

S2 transmits punctured FEC-coded and OFDM/SCCP modulated sequences, where the FEC coded-modulation rate is $R_{S_2R}$ according to Equation 20:

$$R_{S_2R} \leq \alpha_2 I(\text{SNR}_{S_2R}{}^{(1)}) = R_2{}^{(1)} \tag{20}$$

$\alpha_2$ denotes the fraction of time slot 2 used for transmitting S2's information. For frequency division-based orthogonal multiple access such as OFDMA, SC-FDMA and DFT-Spread-OFDM, $\alpha_1=\alpha_2$. For TDMA, $\alpha_2$ denotes the fraction of time that S2 occupies in slot 2. $R_{S_1R}$ and $R_{S_2R}$ may or may not be the same. The BS and RS collect the received sequence. The RS will also decode the information sequence from S1 and S2. The BS then computes and stores the LLR.

8.2.3 Time Slot 3 and 4

The RS re-encodes the information sequences of S1 and S2 with their original rate-compatible FEC. The RS then maps the punctured coded bits to symbols, and then uses OFDMA to modulate the modulated symbols of the two users.

S1 and S2 will also produce the same codeword and map the punctured coded bits to the same symbols as that of the RS, and then to the assigned subcarriers for OFDM transmission processing. Then S1, S2, and the RS transmit the signals simultaneously to the BS, using Alamouti coding scheme.

The overall rate region is given by Equation 21:

$$R_1 \leq \alpha_1 I(\text{SNR}_{S_1D}{}^{(1)}) + \alpha_3 I(\text{SNR}_{S_1D}{}^{(2)} + \text{SNR}_{RD}{}^{(2)}) = R_1{}^{(2)}$$

$$R_2 \leq \alpha_1 I(\text{SNR}_{S_1D}{}^{(2)}) + \alpha_4 I(\text{SNR}_{S_2D}{}^{(2)} + \text{SNR}_{RD}{}^{(2)}) = R_2{}^{(2)} \tag{21}$$

where $\alpha_3$ and $\alpha_4$ are the fraction of resource which S1 and S2 used, respectively. The overall achievable rates are given by Equation 22:

$$R_1 \leq \min(R_1{}^{(1)}, R_1{}^{(2)}),$$

$$R_2 \leq \min(R_2{}^{(1)}, R_2{}^{(2)}) \tag{22}$$

However, if multiple turbo code is used with joint network-channel coding, STBC cannot be employed. The rate region is similar to that of the CMAC.

8.2.4 Rate Setting

Select a target rate for S1 and S2, while assuming values for the $\text{SNR}_{S_1D}$ and $\text{SNR}_{S_2D}$. The values of $\text{SNR}_{S_1D}$ and $\text{SNR}_{S_2D}$ may for example be estimated through the process of channel estimation. If the channel is found to have a transmission rate that is sufficiently high, a direct transmission mode may be used. For example, if both $SNR_{S_1D}$ and $SNR_{S_2D}$ are above a predetermined threshold, a direct transmission mode may be used.

For given values of $SNR_{S_1R}^{(1)}$ and $SNR_{S_2R}^{(2)}$, we can select $\alpha_1$ and $\alpha_2$ such that reliable transmission is possible on both channels. The slot duration should be minimized, i.e., using high-rate coded modulation, so as to improve the overall efficiency based on two considerations. The first consideration is, for decode-forward scheme to work, the RS needs to be close to the source nodes; The second consideration is, the transmission in these two slots do not have any space-time diversity at the BS, whereas the second slot sequences have.

With $\alpha_3$, $\alpha_4$ and the rate region, we can look for a minimum $SNR_{RD}^{(2)}$ threshold which satisfies the target rate. If $SNR_{RD}^{(2)}$ is too low, we will have to lower our target rate and start all over again. Once the rate is determined, a FEC scheme can be chosen to approach this rate.

8.2.5 Receiver Processing

The decoding process is similar to that for the relay network.

8.2.6 Training for Channel Estimation

Training signals can be transmitted in both time slots. In this case, constant-modulus training signals can be used by the S nodes in time slot 1 with which the S-RS channel estimates can be obtained and constant-modulus training signals can be used by the RS in time slot 3 with which the RS-BS channel estimates can be obtained.

Alternatively, we can choose to transmit training signals only in time slot 3. In this case, orthogonal training sequences need to be used between the S and the RS in the respective subcarriers from which the S-BS and the RS-BS channel coefficients can be obtained.

8.2.7 Time and Frequency Synchronization Concurrent transmissions should be aligned within the CP at the receiving node so as to maintain subcarrier orthogonality; S1, S2 and RS should also use the same LO reference, e.g., the LO reference of the BS, for easier frequency synchronization at the D or the R.

8.2.8 Transmission Protocol

Figure 19:
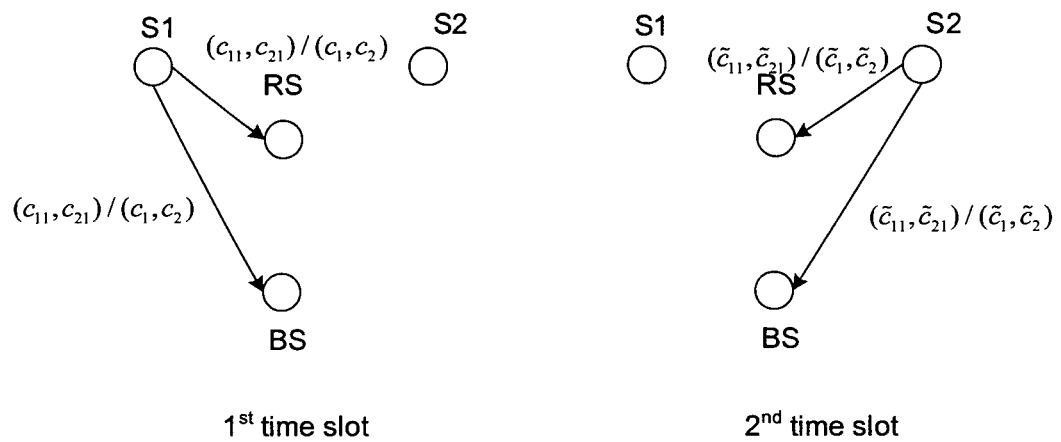
FIG. 19 is an illustration of the MARC: $1^{st}$ and $2^{nd}$ time slot.

Two source nodes S1 and S2 work in cooperation with the RS to deliver their packets to the BS. In the 1$^{st}$ time slot, node S1 transmits while node S2 transmits in the 2$^{nd}$ time slot. The R receives the coded bits sent by both nodes and attempts to decode their information as shown in FIG. 19. For incremental bits, the node S1 sends the codeword $(c_{11},c_{21})$. For joint encoding, the node S1 sends the codeword $(c_1,c_2)$. If decoding is successful, then this information will be relayed to the destination BS. ACK/NACK information is sent out from the RS to indicate whether they are cooperating or not in the 3$^{rd}$ time slot.

Figure 21:
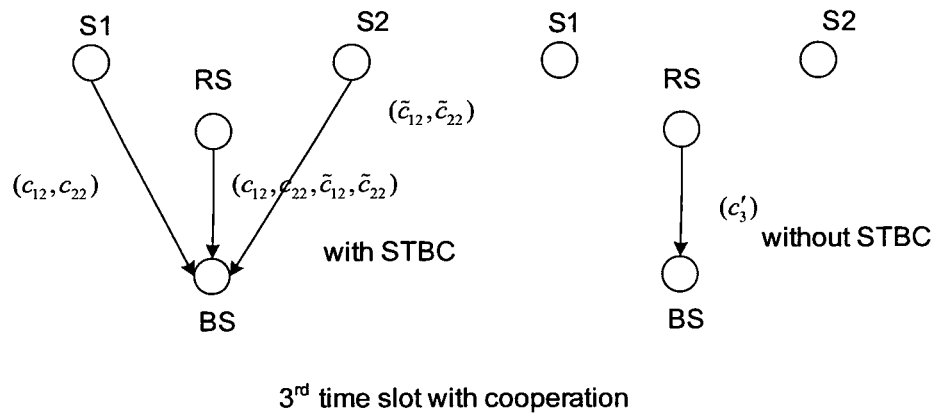
FIG. 21 is an illustration of a MARC: $3^{rd}$ time slot with cooperation.

In the 3$^{rd}$ time slot, cooperation occurs when the relay sends an ACK. Otherwise, S1 and S2 will operate in a non-cooperative mode. In the cooperative configuration that is shown in FIG. 21, the information is decoded correctly. The RS can encode both information bit streams separately and transmit the additional coded bits with the corresponding source together with a STBC, or the RS can jointly encode both information bit streams and transmit to the BS.

Figure 20:
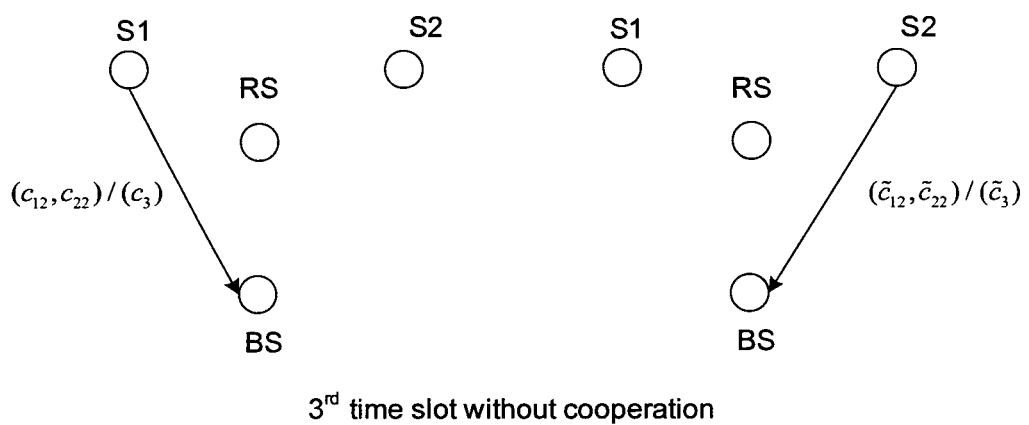
FIG. 20 is an illustration of a MARC: $3^{rd}$ time slot without cooperation.

If the RS fails to decode information from either of S1 or S2, then S1 and S2 will operate in a non-cooperative mode. In FIG. 20, Nodes S1 and S2 transmit their own additional coded bits in turn during the 3$^{rd}$ and last time slot for additional redundancy in the non-cooperative configuration. Similarly, for incremental bits, S1 sends $(c_{11},c_{22})$ and for joint encoding, S1 sends $(c_3)$.

8.3 Broadcast Relay System

FIG. 10 shows a downlink scenario where the BS communicates with two users, S1 and S2 through a RS using OFDMA.

The proposed cooperative incremental redundancy space-time-coded relay transmission may use two time slots to complete one cooperation cycle.

8.3.1 Time Slot 1

To communicate with S1, BS transmits a punctured FEC-coded and OFDM modulated sequence, where the FEC coded-modulation rate is $R_1$. The rate is set such that the BS can decode the data correctly with a high probability, according to Equation 23:

$$R_1 \leq \alpha_1 I(SNR_{BR}^{(1)}) \tag{23}$$

where $\alpha_1$ is the fraction of time slot 1 and $SNR_{BR}^{(1)}$ is the SNR from the BS to the RS.

To communicate with S2, the BS transmits a punctured FEC-coded and OFDM modulated sequence, where the FEC coded-modulation rate is $R_2$. The rate is set such that the BS can decode the data correctly with a high probability. According to Equation 24:

$$R_2 \leq \alpha_2 I(SNR_{BR}^{(1)}) \tag{24}$$

where $\alpha_2$ denotes is the remaining fraction of time slot 1.

S1, S2 and the RS use the received sequences for decoding. The RS will decode both the information sequences meant for S1 and S2. S1 and S2 will then compute and store the LLR.

8.3.3 Time Slot 2

The BS and the RS will both transmit concurrently as follows. The RS re-encodes the information sequences of S1 and S2 with their original rate-compatible FEC. The RS then maps the punctured coded bits to symbols and then OFDMA modulates the modulated symbols of S1 and S2.

The BS will also produce the same codeword and maps the punctured coded bits or new coded bits to the same symbols as that in the RS, and then to the assigned subcarriers for OFDM transmission processing. The BS and the RS then transmit the signals simultaneously to S1 and S2, using an Alamouti coding scheme.

The rate region for time slot 2 is given by Equation 25:

$$R_1 \leq \alpha_1 I(SNR_{BS_1}^{(1)}) + \alpha_3 I(SNR_{BS_1}^{(2)} + SNR_{RS_1}^{(2)})$$

$$R_2 \leq \alpha_2 I(SNR_{BS_2}^{(1)}) + \alpha_4 I(SNR_{BS_2}^{(2)} + SNR_{RS_2}^{(2)}) \tag{25}$$

where $\alpha_3$ and $\alpha_4$ respectively are the fraction of resources in which User 1 and User 2 will use. The overall achievable rates for both slots are constrained by the right-hand side of the above inequalities. Thus according to Equation 26:

$$R_1 \leq \min(\alpha_1 I(SNR_{BR}^{(1)}), \alpha_1 I(SNR_{BS_1}^{(1)}) + \alpha_3 I(SNR_{BS_1}^{(2)} + SNR_{RS_1}^{(2)}))$$

$$R_2 \leq \min(\alpha_2 I(SNR_{BR}^{(1)}), \alpha_2 I(SNR_{BS_2}^{(1)}) + \alpha_4 I(SNR_{BS_2}^{(2)} + SNR_{RS_2}^{(2)})) \tag{26}$$

8.3.4 Transmission Protocol

Figure 22:
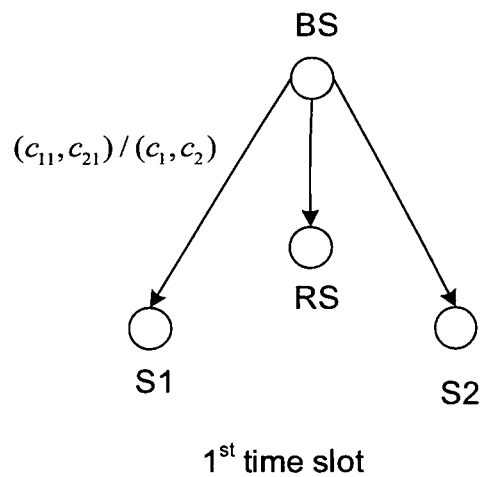
FIG. 22 is an illustration of a BRC: $1^{st}$ time slot.

The BS works in cooperation with RS to deliver its packet to S1 and S2. In the 1$^{st}$ time slot, the BS transmits, as shown in FIG. 22. For incremental bits, node S1 sends the codeword $(c_{11},c_{21})$. For joint encoding, node S1 sends the codeword $(c_1,c_2)$. The RS receives the coded bits and attempts to decode its information. If decoding is successful, this information will then be relayed to S1 and S2. Alternatively if it fails, the BS will operate in a non-cooperative mode. The ACK/NACK information is sent out from the RS to indicate whether the nodes are cooperating or not in the 2$^{nd}$ time slot.

Figure 24:
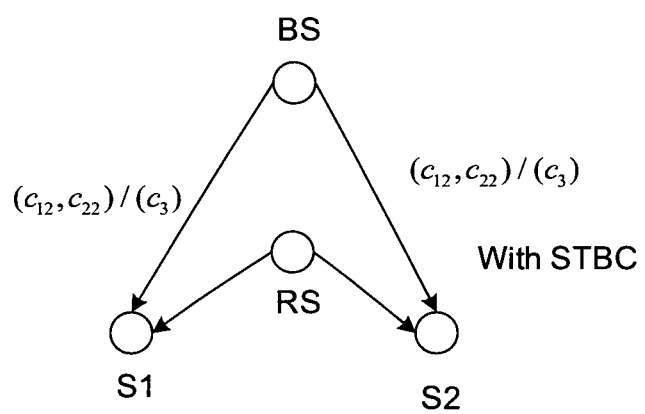
FIG. 24 is an illustration of a BRC: $2^{nd}$ time slot with cooperation.

In the 2$^{nd}$ time slot, cooperation occurs when the RS sends an ACK. Otherwise, S1 and S2 will operation in a non-cooperative mode. For the cooperative configuration in FIG. 24 where the information is decoded correctly, the BS and the RS jointly transmits additional codewords ($c_{12}, c_{22}$) or ($c_3$) to both destinations using a STBC.

Figure 23:
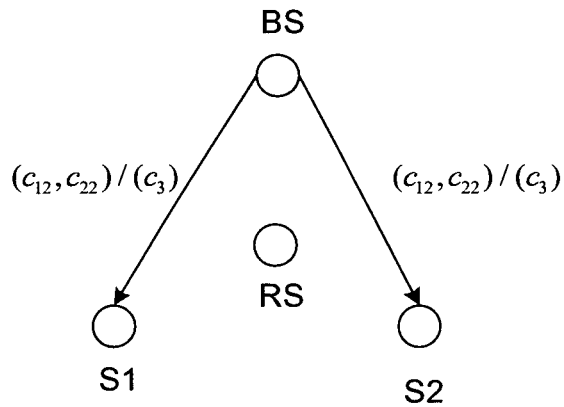
FIG. 23 is an illustration of a BRC: $2^{nd}$ time slot without cooperation.

In the non-cooperative configuration illustrated in FIG. 23, the BS transmits additional coded bits during the $2^{nd}$ and the last time slots for additional redundancy. The codeword ($c_{12}$, $c_{22}$) is sent if an incremental bit is used, and the codeword ($c_3$) is sent when joint encoding is used.

The hardware such as the ICs, UE (eg: S1 and S2), RS, BS, the central office and other network equipment may be programmed with software to operate according to one or more of the example embodiment methods, and otherwise compatible with common standards such as 3G, pre4G and/or 4G. These standards are incorporated herein by reference.

Whilst example embodiments of the invention have been described in detail, many variations are possible within the scope of the invention as will be clear to a skilled reader.

In this specification, the terms "user", "user equipment" (or its abbreviation "UE"), node S1 and node S2 are to be interpreted as equivalents. In some network topologies such as CMAC, other users may act as a RS, and RS and R are to be interpreted accordingly.

What is claimed is:

1. A method of communication comprising:
   determining whether to use a distributed coding between a S, R and D, based on a predetermined transmission rate;
   if it is determined to use the distributed coding, determining a forward error correction scheme for the distributed coding, wherein the scheme includes distributed Alamouti space-time coding, and wherein the scheme is determined based on the predetermined transmission rate, a channel SNR and a network topology; and
   decode and forward relaying space-time block coded data from the S to the D using the determined scheme, wherein determining the scheme includes selecting an additional coding technique from the group consisting of distributed turbo coding, enhanced turbo coding and multiple turbo coding.

2. The method in claim 1 wherein the selection is based on which additional coding technique has a rate region that includes the predetermined transmission rate.

3. The method in claim 1 wherein the determining whether to use distributing coding is made by determining if the SNR from the S to D is too low to support direct transmission.

4. The method in claim 1 wherein the decode and forward relaying relaying space-time block coded data uses rate 1 convolutional or recursive convolutional codes with puncturing patterns.

5. A method of communication comprising:
   determining whether to use a distributed coding between a S, R and D, based on a predetermined transmission rate;
   if it is determined to use the distributed coding, determining a forward error correction scheme for the distributed coding, wherein the scheme includes distributed Alamouti space-time coding, and wherein the scheme is determined based on the predetermined transmission rate, a channel SNR and a network topology; and
   decode and forward relaying space-time block coded data from the S to the D using the determined scheme wherein the network topology is selected from the group consisting of a relay network, a CMAC network, a MARC network and a BRC network.

6. A method of communication comprising:
   determining whether to use a distributed coding between a S, R and D, based on a predetermined transmission rate;
   if it is determined to use the distributed coding, determining a forward error correction scheme for the distributed coding, wherein the scheme includes distributed Alamouti space-time coding, and wherein the scheme is determined based on the predetermined transmission rate, a channel SNR and a network topology; and
   decode and forward relaying space-time block coded data from the S to the D using the determined scheme wherein the determined scheme includes a plurality of slots in the time domain, a first slot being used by S to transmit a code word, if R can decode the code word then in a subsequent slot the relaying coded data is done cooperatively by the S and R.

7. The method in claim 6 wherein the code word is relayed using a STBC.

8. A method of communication comprising:
   determining whether to use a distributed coding between a S, R and D, based on a predetermined transmission rate;
   if it is determined to use the distributed coding, determining a forward error correction scheme for the distributed coding, wherein the scheme includes distributed Alamouti space-time coding, and wherein the scheme is determined based on the predetermined transmission rate, a channel SNR and a network topology; and
   decode and forward relaying space-time block coded data from the S to the D using the determined scheme wherein a code word is optimized based on the channel SNR.

9. A method of communication comprising:
   determining whether to use a distributed coding between a S, R and D, based on a predetermined transmission rate;
   if it is determined to use the distributed coding, determining a forward error correction scheme for the distributed coding, wherein the scheme includes distributed Alamouti space-time coding, and wherein the scheme is determined based on the predetermined transmission rate, a channel SNR and a network topology; and
   decode and forward relaying space-time block coded data from the S to the D using the determined scheme using ODMA, TDMA, OFDMA, SC-FDMA, DFT-Spread-OFDM or SDMA.

10. A RS configured to communicate with a plurality of UE according to a method of communication comprising:
    determining whether to use a distributed coding between a S, R and D, based on a predetermined transmission rate;
    if the it is determined to use the distributed coding, determining a forward error correction scheme for the distributed coding, wherein the scheme includes distributed Alamouti space-time coding, and wherein the scheme is determined based on the predetermined transmission rate, a channel SNR and a network topology; and
    decode and forward relaying space-time block coded data from the S to the D using the determined scheme, wherein determining the scheme includes selecting an additional coding technique from the group consisting of distributed turbo coding, enhanced turbo coding and multiple turbo coding.

11. A RS configured to communicate with a BS according to a method of communication comprising:
    determining whether to use a distributed coding between a S, R and D, based on a predetermined transmission rate;
    if it is determined to use the distributed coding, determining a forward error correction scheme for the distributed coding, wherein the scheme includes distributed Alamouti space-time coding, and wherein the scheme is determined based on the predetermined transmission rate, a channel SNR and a network topology; and decode and forward relaying space-time block coded data from the S to the D using the determined scheme, wherein determining the scheme includes selecting an additional coding technique from the group consisting of distributed turbo coding, enhanced turbo coding and multiple turbo coding.

12. A BS configured to communicate with a plurality of UE according to a method of communication comprising:

determining whether to use a distributed coding between a S, R and D, based on a predetermined transmission rate;

if it is determined to use the distributed coding, determining a forward error correction scheme for the distributed coding, wherein the scheme includes distributed Alamouti space-time coding, and wherein the scheme is determined based on the predetermined transmission rate, a channel SNR and a network topology; and decode and forward relaying space-time block coded data from the S to the D using the determined scheme, wherein determining the scheme includes selecting an additional coding technique from the group consisting of distributed turbo coding, enhanced turbo coding and multiple turbo coding.

13. A communications network configured to communicate according to a method of communication comprising:

determining whether to use a distributed coding between a S, R and D, based on a predetermined transmission rate;

if it is determined to use the distributed coding, determining a forward error correction scheme for the distributed coding, wherein the scheme includes distributed Alamouti space-time coding, and wherein the scheme is determined based on the predetermined transmission rate, a channel SNR and a network topology; and decode and forward relaying space-time block coded data from the S to the D using the determined scheme, wherein determining the scheme includes selecting an additional coding technique from the group consisting of distributed turbo coding, enhanced turbo coding and multiple turbo coding.

14. A UE configured to communicate with a BS according to a method of communication comprising:

determining whether to use a distributed coding between a S, R and D, based on a predetermined transmission rate;

if the it is determined to use the distributed coding, determining a forward error correction scheme for the distributed coding, wherein the scheme includes distributed Alamouti space-time coding, and wherein the scheme is determined based on the predetermined transmission rate, a channel SNR and a network topology; and decode and forward relaying space-time block coded data from the S to the D using the determined scheme, wherein determining the scheme includes selecting an additional coding technique from the group consisting of distributed turbo coding, enhanced turbo coding and multiple turbo coding.

15. An integrated circuit or processor including stored instructions, the instructions when executed control communication between a BS and a UE according to a method of communication comprising:

determining whether to use a distributed coding between a S, R and D, based on a predetermined transmission rate;

if the it is determined to use the distributed coding, determining a forward error correction scheme for the distributed coding, wherein the scheme includes distributed Alamouti space-time coding, and wherein the scheme is determined based on the predetermined transmission rate, a channel SNR and a network topology; and decode and forward relaying space-time block coded data from the S to the D using the determined scheme, wherein determining the scheme includes selecting an additional coding technique from the group consisting of distributed turbo coding, enhanced turbo coding and multiple turbo coding.

* * * * *